United States Patent [19]

Lindmayer

[11] 3,895,975

[45] July 22, 1975

[54] METHOD FOR THE POST-ALLOY DIFFUSION OF IMPURITIES INTO A SEMICONDUCTOR

[75] Inventor: Joseph Lindmayer, Bethesda, Md.

[73] Assignee: Communications Satellite Corporation, Washington, D.C.

[22] Filed: Feb. 13, 1973

[21] Appl. No.: 331,740

[52] U.S. Cl. .................. 148/178; 148/177; 148/186

[51] Int. Cl. .............................................. H01i 7/46

[58] Field of Search ........... 148/177, 178, 186, 188, 148/187; 117/227; 29/569, 25.3

[56] References Cited

UNITED STATES PATENTS

| | | | |
|---|---|---|---|
| 3,044,147 | 7/1962 | Armstrong | 29/25.3 |
| 3,208,889 | 9/1965 | Emeis | 148/177 |
| 3,212,940 | 10/1965 | Blankenship | 148/177 |
| 3,513,040 | 5/1970 | Kaye et al. | 148/178 |
| 3,577,287 | 5/1971 | Norwich et al. | 148/189 |
| 3,596,347 | 8/1971 | Beale et al. | 148/187 |

FOREIGN PATENTS OR APPLICATIONS

| | | | |
|---|---|---|---|
| 865,471 | 4/1961 | United Kingdom | 148/177 |

*Primary Examiner*—Walter R. Satterfield
*Attorney, Agent, or Firm*—Sughrue, Rothwell, Mion, Zinn & Macpeak

[57] ABSTRACT

A method of making a solar cell or other semiconductor junction devices including the process of diffusing an impurity of a first type conductivity into the front surface of a semiconductor bulk material while simultaneously alloying and diffusing an impurity of a second type conductivity into the back surface of the semiconductor bulk material from a metallic source. During this simultaneous doping, the back surface area of the semiconductor and the second type metallic impurity are in a molten alloy state.

6 Claims, 8 Drawing Figures

METHOD FOR THE POST-ALLOY DIFFUSION OF IMPURITIES INTO A SEMICONDUCTOR

BACKGROUND OF THE INVENTION

This invention relates to a method of making solar cells and other semiconductor devices and, more particularly, to a method of simultaneously introducing impurities of opposite type conductivities into respective front and back surfaces of a semiconductor bulk material.

In the conventional method of producing solar cells, an impurity, for example, phosphorus (n-type), is diffused into one surface of a wafer of semiconductor bulk material such as p-type silicon to provide an n-p junction near that surface. One problem associated with this diffusion technique is that the phosphorus also diffuses into the opposite surface of the silicon to provide another n-p junction near that surface. Each of these two n-p junctions result in an electric field that opposes the field of the other junction, i.e. the representative vectors of the electric fields produced by each junction are in opposite directions. Each field thereby tends to cancel the other thereby effectively reducing the voltage output of the semiconductor. In order to eliminate the effect of the second junction it is necessary to remove the back volume of the silicon wafer having the diffused phosphorus and n-p junction. The prior art teaches several methods of removing such volume, one of which is by means of an etching technique.

In addition, due to the dimensions of the silicon wafer, diffusion of the phosphorus in the conventional manner causes stresses over the entire silicon bulk material. As a result of such stresses there is a "softening" of the desired n-p junction, i.e. strong space charge recombination occurs which prevents the achievement of ideal diode characteristics due to shunting of junction currents. Consequently, the well-known fill-factor (or "i-v" characteristics) of the semiconductor diode is not close to ideal. Also, the stresses cause damage to the crystal lattice of the semiconductor. As is well known in the art, minority carriers have the highest lifetime in a perfect crystal and lattice damage results in a shortening of the lifetime of minority carriers in and even beyond the diffused region due to recombination at the damaged crystal lattice sites.

In the conventional method for producing solar cells, an ohmic contact is applied to the surface from which the unwanted volume including n-p junction had been removed (typically the "back" surface of a solar cell that is not to be exposed to sunlight). The metal desposited on the back surface is normally a Ti-Ag contact which provides the ohmic contact. This type of contact, however, results in a high rate of recombination for photogenerated carriers at the semiconductor-metal interface, particularly those carriers which are generated by deeply penetrating red light. In order to eliminate the recombination effect, the prior art would dope the etched back surface with a common dopant, having the same conductivity as the semiconductor bulk material, e.g. boron (p-type), prior to applying the ohmic contact. In such situations, a junction, known as $p^+$-p junction, is formed in the semiconductor material near the back surface. This junction provides an electric field, having a representative vector in the same direction as the desired n-p junction, that shields carriers from the interface beween the Ti-Ag contact and the semiconductor. However, the method used to provide the $p^+$—p junction near the back surface involves standard diffusion techniques wherein the impurity, e.g. boron, is diffused into the back surface with the use of an appropriate diffusion gas. This second doping process introduces damaging stresses into the semiconductor bulk material and may result in contamination of the front surface since there is no shielding at the front surface to prevent the boron from diffusing therein.

SUMMARY OF THE INVENTION

The above disadvantages may be overcome by diffusing a first impurity having a conductivity opposite to that of the semiconductor bulk material into the front surface of the semiconductor while simultaneously providing a molten alloy at the back surface of the semiconductor. The alloy comprises the semiconductor and a second impurity, having the same type of conductivity as the semiconductor.

The present invention enables the diffusion of a first type impurity, having a conductivity opposite to that of the semiconductor bulk material, through only the front surface of the semiconductor. The back surface is shielded from contamination by the first type impurity. This has the advantage of eliminating the back area removal process described above.

In addition, the diffusion technique practiced with the present invention significantly reduces stresses over the whole semiconductor wafer. Consequently, the diffused junction is closer to ideal, thereby minimizing the space change recombination and increasing the lifetime of minority carriers generated in the diffused region.

Moreover, the present invention enables a second type impurity, having a conductivity that is the same as the semiconductor bulk material to be simultaneously alloyed and diffused into the back surface of the semiconductor. In accordance with one embodiment of the present invention a metal having such conductivity would be alloyed and diffused into the back surface of the semiconductor. In this manner two junctions are formed whose resulting electric fields have representative vectors in the same direction and thereby shield the carriers from recombination at the semiconductor-back contact interface.

Also, if the second type impurity that is alloyed and diffused into the back surface is a metal, a highly conductive back layer, which enables the collection of photocurrent uniformly over the whole surface, is provided.

In accordance with one embodiment of the present invention, a semiconductor bulk material having dimensions suitable for use as a solar cell first is polished and cleaned in a conventional manner. Next, a first type impurity, particularly a metal, having the same conductivity as the semiconductor is deposited onto the back surface of the semiconductor wafer in accordance with techniques that are well known in the art. The semiconductor having a deposited metal impurity is then placed into a diffusion furnace in the presence of an inert gas and at a temperature such that the region at the back surface of the semiconductor becomes a molten alloy comprising the metal impurity and the semiconductor. Thereafter, a second type impurity of opposite type conductivity also is introduced into the diffusion furnace through suitable diffusion gas vehicle. The two types of impurities are allowed to diffuse into the respective surfaces of the semiconductor to form the two desired junctions. When the diffused semiconductor is removed from the diffusion furnace, it is ready to have the necessary current collecting contacts and any anti-reflective coating placed thereon to form a solar cell. As will be more fully described, the step during which diffusion of the gas impurity occurs may take place at the same time as, or subsequent to, the formation of the molten alloy.

DETAILED DESCRIPTION OF THE INVENTION

Figure 1A:
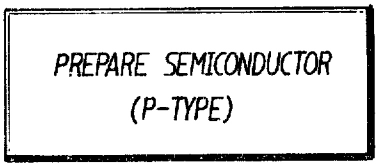
FIGS. 1A through 1D show a flow diagram of one embodiment of the diffusion process of the present invention.
Figure 2A:
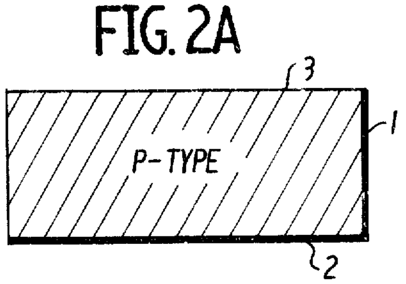
FIGS. 2A through 2D corresponding, respectively, to FIGS. 1A through 1D, show the semiconductor bulk material during the various process steps of the present invention.
Figure 1B:
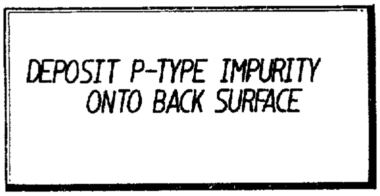
Figure 2B:
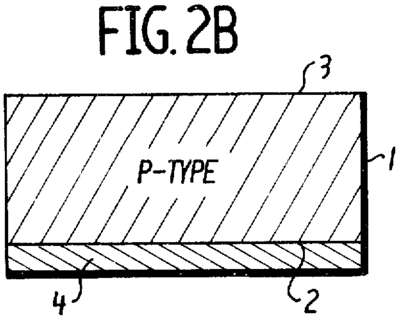
Figure 1C:
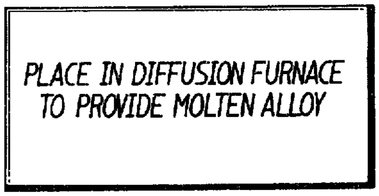

In accordance with the present invention, a wafer of semiconductor bulk material, e.g. p-type silicon, having a back surface 2 and front surface 3 (the surface through which light will enter the solar cell) and dimensions suitable for use as a solar cell, as shown in FIG. 2A, is cleaned and polished in a conventional manner. As a second step, a layer 4 of p-type material, e.g., aluminum, about 5000–10,000 A thick, is deposited onto the back surface 2 of the silicon 1, as shown in FIG. 2B. The range of thicknesses is merely representative of a preferred deposit of aluminum. Other thicknesses may be used; however, a layer less than 2000 A may not provide enough stress relief and a layer greater than 10,000 A may result in a rough back surface of aluminum. The p-type layer 4 of aluminum may be deposited onto the back surface 2 of the silicon wafer 1 by means of a standard boat evaporation technique. As is well known in the art, a boat containing an ingot of the metal to be evaporated is heated to a temperature above the melting point of the metal in a total or partial vacuum. In the preferred embodiment, an aluminum ingot is heated to about 1500°C in a partial vacuum environment including a small amount of oxygen. The aluminum atoms that are evaporated will condense on the back surface of the solar cell that is exposed to the ingot. For the boat evaporation technique, it has been found that the aluminum will form a smoother surface when deposited onto the silicon with some oxygen present that it would when deposited in a very high vacuum. Other known deposition techniques such as electron beam evaporation, sputtering and plating may also be used.

Figure 2C:
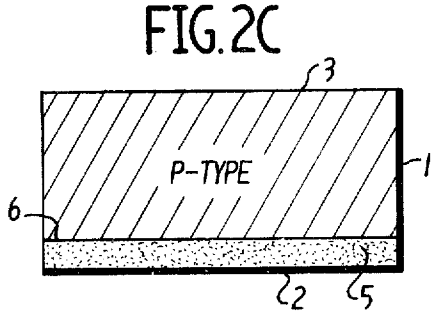
Figure 1D:
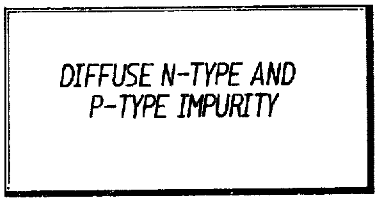

The silicon wafer 1 having aluminum layer 4 deposited on the back surface is now placed into the diffusion chamber of a standard diffusion furnace. The wafer will lie on a quartz tray with its coated surface face down and its front surface 3 exposed to the inside of the diffusion furnace chamber. The wafer will remain in the diffusion furnace for a period of about 15 minutes at a temperature of about 800°C. Under these conditions, since the temperature is above the eutectic temperature of the silicon-aluminum combination (577°C) and the melting point of aluminum (660°C), the aluminum layer 4 and adjoining silicon will form a pool of molten silicon-aluminum alloy 5 at the back surface of the silicon wafer, as shown in FIG. 2C. When the coated silicon wafer is first placed into the diffusion furnace the diffusion chamber should have in it only an inert gas, such as nitrogen or argon.

At this stage in the process a junction 6 is formed which may be characterized as a $p^+$—p junction. That is, the molten silicon-aluminum alloy 5 comprises a very heavily doped p-type region (i.e. $p^+$) while the remaining silicon 1, which is still crystalline, comprises the original p-type region. The silicon remains crystalline because its melting point is well about 800°C.

Figure 2D:
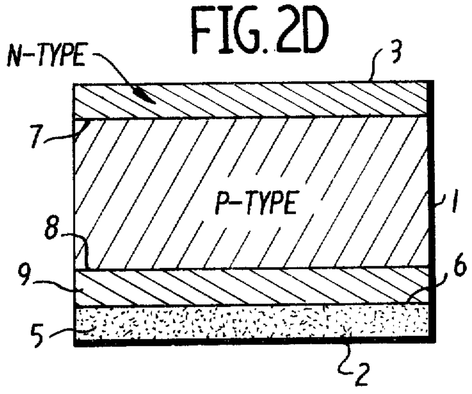

After the silicon-aluminum alloy has been formed in the furnace, the wafer is ready to have an n-type impurity, preferably phosphorus, diffused through the front surface 3. To enable diffusion of the phosphorus, a diffusion gas comprising $N_2$, $O_2$ and $PH_3$ (1 percent in Argon) may be used. The diffusion gas will flow through the diffusion furnace chamber at a rate of 1000 cc/min. for $N_2$, 75 cc/min. for $O_2$ and 550 cc/min. for $PH_3$ in a manner well known in the art. The inert gas originally in the chamber will be exhausted by the flow of diffusion gas. Diffusion of the phosphorus is allowed to continue for a period of approximately ten minutes at a temperaure of about 800°C. In this manner a shallow n-p junction 7, as shown in FIG. 2D, is provided at a depth below the front surface 3 of the silicon 1, as will be more fully described below.

Once the n-type phosphorus has been diffused into the front surface 3 to form the desired junction, the silicon wafer is removed from the furnace and is allowed to cool to room temperature. The molten silicon-aluminum alloy 5 solidifies into the back surface 2 of the silicon wafer 1. The interface between the aluminium-silicon alloy and the bulk silicon provides what may be described as a $p^+$—p junction 8. That is, the alloy provides a heavily doped p-type (i.e. $p^+$) region 9. In this manner, a n-p junction 7 and a $p^+$—p junction 8 are simultaneously formed, as shown in FIG. 2D. Although some diffusion of the aluminum atoms into the silicon bulk material may take place during the alloying step and form an intermediate junction between the diffused silicon and the alloy, this effect is small in the preferred embodiment and may be neglected.

At this point it would be helpful to review some of the advantages obtained with the diffusion process of the present invention. First, it has been found that a more ideal n-p junction 7 and $p^+$—p junction 8 can be obtained. The small pool of molten silicon-aluminum alloy 5 relieves mechanical stresses throughout the whole silicon wafer 1 which would damage the crystal lattice and prevent the uniform formation of a sharp junction. Secondly, the pool of molten alloy prevents any of the phosphorus from diffusing into the back surface 2 of the silicon 1. Such phosphorus diffusion, if allowed, would tend to contaminate the back surface 2 thereby producing an undesirable n-p junction near the back surface 2. Finally, the presence of the $p^+$—p junction 8 will reduce the recombination of carriers generated in the p-type silicon 1, thereby enhancing the solar cell current and to a smaller degree the voltage output.

Finally, to complete the manufacture of the solar cell, front and back surface photocurrent collecting metallic contacts (not shown) may be applied in accordance with the technique described in the patent application entitled "Fine Geometry Solar Cell," Ser. No. 184,393, to Lindmayer, or by any conventional technique.

Although the preferred embodiment of the invention has been described for specific materials and specific conditions, the objects of stress relief, contamination protection and simultaneous formation of sharp junctions on opposite surfaces of a solar cell may be achieved by other materials and under other conditions.

Using aluminum as the $p^+$ impurity, the coated wafer may be placed in a diffusion furnace at a temperature in the range of 750°–900°C. Depending upon the depth of n-p junction to be achieved, and the degree to which stress relief techniques are refined, the time during which the wafer will remain in the chamber and the combination of gasses used in the diffusion chamber may be varied in a manner well known in the art to optimize the desired characteristics of the cell. The diffusion gas for the first type impurity may include $POCl_3$ rather than $PH_3$ if desired. Diffusion gasses containing other n-type impurities from column 5 of the periodic table may also be used in a manner well known in the art.

The discussion thus far has been in connection with the use of aluminum as a p-type dopant. However, it has been found that most of the elements of column 3A of the periodic table, i.e. aluminum, gallium and indium and combinations of these elements will provide several of the advantages described above. More specifically, it has been found that indium will provide a molten silicon-indium alloy for purposes of providing stress relief and prevention of phosphorus diffusion into the back surface 2. Compositions of gallium and aluminum, and indium and aluminum, also will provide both the stress relief and $p^+$—p type junction. Thallium or a combination of thallium and aluminum, gallium or indium will also provide some of the advantages described above. The conditions under which these elements are used in accordance with the method of the present invention may readily be determined by one of ordinary skill in the art.

The basic teachings of the present invention also may be applied to n-type semiconductor materials. Of course, the impurities used would be of opposite type to those used in the present invention and would be determinable by one of ordinary skill in the art. The present invention is not limited to solar cells but may be applied to other junction semiconductor devices where particularly stress relief and contamination prevention are desirable objects.

In the application of solar cells to space environments, it is well recognized that in many cases solar radiation will damage, and even destroy, the advantage of the $p^+$—p type junction in a relatively short period of time. Therefore, the above-decribed advantages obtainable with such a $p^+$—p junction are quickly eliminated. However, it would still be desirable to form a $p^+$—p type junction according to the process described above since the advantages of stress relief and phosphorus shielding from the back surface 2 would be maintained during the lifetime of solar cells in space. In addition, if the solar cells are required for terrestrial use there will be very little radiation damage to the solar cell. Consequently, the advantages acquired with the $p^+$—p type junction may be maintained for the lifetime of the solar cell when used on earth.

The ranges of temperature and time for diffusion of phosphorus, as described above, will provide a relatively shallow n-p junction 7 approximately 1000–2000 A from the front surface 3. The reasons for, and advantages of, such a shallow junction have been described in connection with a fine geometry solar cell described in a co-pending patent application entitled "Fine Geometry Solar Cell" by Joseph Lindmayer, Ser. No. 184,393, assigned to the assignee of the present invention. That application describes a solar cell which has the advantage of being responsive to light in the short wavelength region which is the region where the solar energy peaks. As described therein, by diffusing a significantly lower total number of phosphorus impurities into the front surface of the solar cell, crystal lattice damage is reduced. Reduction of the damage to the crystal lattice results in the creation of an improved n-p junction. Such a lower total number of phosphorus impurities is also diffused in connection with the process described in the present application. However, with the diffusion method of the present invention, crystal lattice damage is further reduced by means of the stress relief provided by the molten alloy layer 5 and the n-p junction produced is close to ideal.

I claim:

1. In a method of fabricating a solar cell out of a slice of semiconductor material having first and second major surfaces which constitute the front light receiving surface and the back semiconductor surface, respectively, of the fabricated solar cell, said method being of the type wherein a p-n junction is formed by diffusing a dopant of a first type conductivity into said first major surface of said slice of semiconductor material having a second type conductivity opposite said first type conductivity, the improvement in said method comprising the steps of:

a. placing a layer of material on said second major surface of said slice prior to the formation of said p-n junction, said layer of material being characterized in that it will form an alloy with the semiconductor at temperatures below the melting point of said semiconductor material and it contains atoms which are dopant atoms of said second type conductivity, b. heating said slice with said layer of material thereon to a temperature sufficient to cause said material to alloy with said semiconductor material and be in a molten state and said dopant atoms of a second type conductivity to diffuse into said slice from said material thereby forming a heavily doped region of said second type in said slice near said second major surface of said slice, and c. subsequently diffusing said dopant of a first type conductivity into said first major surface from a gaseous mixture containing atoms of said dopant at a temperature above the melting point of said material and above the alloying and melting point of an alloy of said material and said semiconductor, wherein said semiconductor slice is silicon and said layer of material comprises a metal selected from the group consisting of aluminum, indium, gallium and thallium.

2. The method of claim 1 wherein said semiconductor slice is silicon and said layer of material comprises aluminum.

3. The method of claim 2 wherein said dopant of a first type conductivity is phosphorus.

4. The method of claim 3 wherein the step of heating comprises heating for approximately 15 minutes at a temperature within the range of 750°–850° C.

5. In a method of fabricating a solar cell out of a slice of semiconductor material having first and second major surfaces which constitute the front light receiving surface and the back semiconductor surface, respectively, of the fabricated solar cell, said method being of the type wherein a p-n junction is formed by diffusing a dopant of a first type conductivity into said first major surface of said slice of semiconductor material having a second type conductivity opposite said first type conductivity, the improvement in said method comprising the steps of:

a. depositing a layer of aluminum to a thickness of between 2,000 A and 10,000 A on said second major surface of a thin slice of p-type monocrystalline silicon, b. heating said slice with said layer at a temperature above the silicon-aluminum eutectic temperature for a sufficient time to cause diffusion of some aluminum atoms into said second major surface to increase the p-type concentration of said slice near said second major surface and to cause alloying of silicon and aluminum, and c. diffusing from a gaseous mixture an n-type dopant into said first major surface of said slice at a temperature high enough to cause said aluminum-silicon alloy and any aluminum remaining to be in a molten state during said diffusing.

6. The method of claim 5 wherein said n-type dopant is phosphorous.

* * * * *